United States Patent
Krunks et al.

(10) Patent No.: US 8,614,393 B2
(45) Date of Patent: Dec. 24, 2013

(54) PHOTOVOLTAIC CELL BASED ON ZINC OXIDE NANORODS AND METHOD FOR MAKING THE SAME

(75) Inventors: Malle Krunks, Tallinn (EE); Atanas Katerski, Tallinn (EE); Tatjana Dedova, Tallinn (EE); Arvo Mere, Tallinn (EE); Ilona Oja Acik, Tallinn (EE)

(73) Assignee: Tallinn University of Technology, Tallinn (EE)

( * ) Notice: Subject to any disclaimer, the term of this patent is extended or adjusted under 35 U.S.C. 154(b) by 371 days.

(21) Appl. No.: 12/668,443

(22) PCT Filed: Jul. 9, 2008

(86) PCT No.: PCT/EE2008/000019
§ 371 (c)(1),
(2), (4) Date: Jan. 11, 2010

(87) PCT Pub. No.: WO2009/006910
PCT Pub. Date: Jan. 15, 2009

(65) Prior Publication Data
US 2010/0186805 A1    Jul. 29, 2010

Related U.S. Application Data

(60) Provisional application No. 60/948,508, filed on Jul. 9, 2007.

(51) Int. Cl.
*H01L 31/042*  (2006.01)
*H01L 31/00*   (2006.01)
*H01L 21/00*   (2006.01)

(52) U.S. Cl.
USPC .......... 136/250; 136/260; 136/256; 136/255; 438/63; 438/57; 438/86; 257/248

(58) Field of Classification Search
USPC ........ 136/255, 260, 256, 250; 438/63, 57, 86; 257/248
See application file for complete search history.

(56) References Cited

U.S. PATENT DOCUMENTS

2003/0140959 A1*  7/2003  Gaudiana et al. ............. 136/244
2005/0271827 A1* 12/2005  Krunks et al. ................ 427/446

OTHER PUBLICATIONS

M.J. Height, L. Madler, S.E. Pratsinis, "Nanorods of ZnO made by flame spray pyrolysis", Chemistry of Materials, 18, p. 572-578, Nov. 3, 2005.*

(Continued)

*Primary Examiner* — Jennifer Michener
*Assistant Examiner* — Marla D McConnell
(74) *Attorney, Agent, or Firm* — Maine Cernota & Rardin (57) ABSTRACT

A new photovoltaic (PV) cell structure, prepared on transparent substrate with transparent conductive oxide (TCO) layer and having nanorod zinc oxide layer. The cell has a thin conductive layer of doped zinc oxide deposited on the nanorod zinc oxide layer, an extremely thin blocking layer of titanium oxide or indium sulfide on the thin conductive layer, a buffer layer of indium sulfide on the extremely thin blocking layer, an absorber layer, comprising copper indium disulfide on said buffer layer and one electrode attached to the transparent conductive oxide layer and a second electrode attached to the absorber layer. Also, a method of preparing a zinc oxide nanorod PV cell entirely by chemical spray pyrolysis is disclosed. Efficiency up to 3.9% is achieved by simple continuous non-vacuum process.

7 Claims, 7 Drawing Sheets

(56) References Cited

OTHER PUBLICATIONS

M. Law, L.E. Greene, A. Radenovic, T. Kuykendall, J. Lihardt, P. Yang, "ZnO-Al2O3 and ZnO-TiO2 core shell nanowire dye sensitized solar cells" J. Phys. Chem. B, 11, p. 22652-22663, Oct. 12, 2006.*

R. Tena-Zaera, M.A. Ryan, A. Katty, G. Hodes, S. Bastide, C. Levy-Clement, "Fabrication and characterization of ZnO nanowires/CdSe/CuSCN eta-solar cell", C.R. Chimie, 9, pf 717-729, Sep. 15, 2005.*

M. Krunks, T. Dedova, I. Oja Acik, "Spray pyrolysis deposition of zinc oxide nanostructured layers", Thin Film solids, 515, p. 1157-1160, Sep. 20, 2006.*

Q. Li, V. Kumar, Y. Li, H. Zhang, T.J. Marks, R.P.H. Chang, "Fabrication of ZnO Nanorods and Nanotubes in Aqueous Solutions", Chemistry of Materials, 17, p. 1001-1006, online in 2004.*

H. Wei, Y. Wu, N. Lun, c. Hu, "Hydrothermal synthesis and characterization of ZnO nanorods", Materials Science and Engineering A, 393, p. 80-82, online 2004.*

H.G. Yang, H.C. Zeng, "Synthetic Architectures of TiO2/H2Ti5O11 H2O, Zno/H2Ti5O11 H2O, ZnO/TiO2/H2Ti5o11 H2O and ZnO/TiO2 nanocomposites", JACS, 127, p. 270-278. online 2004.*

T.T. John, M. Mathew, S. Kartha, K.P. Vijayakumar, T. Abe, Y. Kashiwaba, "CunInS2/In2S3 thin film solar cell using spray pyrolysis technique having 9.5% efficiency", Solar Energy Materials and Solar cells, 89, p. 27-36, Oct. 14, 2005.*

* cited by examiner

PHOTOVOLTAIC CELL BASED ON ZINC OXIDE NANORODS AND METHOD FOR MAKING THE SAME

RELATED APPLICATIONS

This application is a 371 of PCT Application No. PCT/EE2008/000019 filed Jul. 9, 2008 which claims the benefit of U.S. Provisional Patent Application 60/948,508 filed Jul. 9, 2007. Each of these applications is herein incorporated by reference in their entirety for all purposes.

BACKGROUND OF THE INVENTION

1. Technical Field

The invention relates to photovoltaic cells and methods of making photovoltaic cells, particularly to methods of manufacturing photovoltaic cells on ZnO nanorod structures, whereas all layers of the nanorod structure are preferably prepared by chemical spray pyrolysis.

2. Background Art

Photovoltaic (PV) cell is a device that converts light energy into electrical energy. Harnessing solar energy with inexpensive materials and manufacturing methods is an important challenge. Low cost deposition techniques and new designs of PV devices are needed to reduce the production costs. There has been much interest of using nanostructures in PV devices. Dye sensitized photoelectrochemical solar cell (DSSC) based on nanoporous titanium dioxide is the most known nanostructured PV device (B. O'Regan and M. Grätzel, Nature 353, 737 (1991)). Unsolved problem with DSSC is its instability, also of its solid-state modifications. Another approach is an extremely thin absorber (eta) cell which has an extra thin absorber sandwiched between two strongly interpenetrating transparent wide band gap semiconductors (K. Ernst, et al, Semicond. Sci. Technol. 18, 475 (2003)). Most frequently used n-type nanostructured window material for the eta-solar cell is porous $TiO_2$. Alternatively, ZnO nanowires or columnar ZnO structures have been used to prepare ZnO eta-cells (C. Lévy-Clément, et al, Physica E 14, 229 (2002)). Inorganic absorber materials like CdTe (C. Lévy-Clément, et al above; R. Tena-Zaera, et al, Thin Solid Films 483, 372 (2005)), CdSe (Lévy-Clément, et al, Advanced Materials 17, 1512 (2005); R. Tena-Zaera, et al, C. R. Chimie 9, 717 (2006); R. Tena-Zaera, et al Proceedings 21st European PV Solar Energy Conf., 4-8 Sep. 2006, Dresden, Germany (2006), p.238) or $In_2S_3$ (D. Kieven et al, Applied Physics Letters 92, 153107 (2008)) have been used in ZnO based cells. The conversion efficiencies of 2.3-2.5% are reached in ZnO nanowire based eta-cells (see C. R. Chimie, above; D. Kieven et al, above).

ZnO nanowire layers for photovoltaic applications have been fabricated by electrodeposition (see C. Lévy-Clément, R. Tena-Zaera above), metalorganic vapour deposition (J. B. Baxter and E. S. Aydil, Sol. Energ. Mater. Solar Cells 90, 607 (2006)), hydrothermal growth (M. Guo, P. Diao, X. Wang and S. Cai, J. Solid State Chem. 178, 3210 (2005) and solution deposition (D. Kieven et al, above).

In US patent application to Yang et al (Publication No. US 2005/0009224A1) is described a method of growing zinc oxide nanowires (aspect ratios between about 10 to about 500) on transparent conductive oxide (TCO) covered substrate, such as glass, and dye sensitized solar cells, organic-inorganic solar cells and solid state sensitized solar cells built on such nanowires. The nanowires in Yang are deposited by solution based processes, e.g., by dip coating process.

Recently we have developed a low-cost deposition method of growing zinc oxide nanorod arrays on conductive transparent electrodes by chemical spray (M. Krunks, et al, U.S. provisional application 60/671232; international patent application PCT/EE2006/000002, published as WO2006108425).

DISCLOSURE OF THE INVENTION

Embodiments of the invention are directed to novel structures of a photovoltaic (PV) cell, based on nanorod layer, and methods for making the same.

One aspect of the invention is a new PV cell, comprising a transparent substrate covered with transparent conductive oxide (TCO) layer, a nanorod metal oxide layer on said TCO layer, a (chemically) blocking layer on said nanorod metal oxide layer, a buffer layer on said blocking layer, an absorber layer on said buffer layer, and electrical contacts attached to said absorber layer and to said TCO layer.

According to one embodiment, the nanorod metal oxide layer is a ZnO nanorod layer. According to one embodiment, the ZnO nanorod layer is deposited by spray from solution containing $ZnCl_2$.

According to one embodiment, the transparent substrate is glass, and the TCO layer is an indium tin oxide (ITO), doped $SnO_2$, or doped ZnO layer.

According to one embodiment, the extremely thin blocking layer comprises $TiO_2$ and has thickness less than 10 nm, preferably less than 5 nm. According to one embodiment, the extremely thin blocking layer comprises $In_xS_y$. According to one embodiment, the buffer layer comprises $In_2S_3$, CdS or ZnS. According to one embodiment, the absorber layer comprises $CuInS_2$, or other Cu-based chalcopyrites such as $CuInS_2$, $CuInSe_2$, $CuInGaS_2$, $CuInGaSe_2$ and their solid solutions, or analogous Ag-based compounds and their solid solutions; or In-free CZTS-type compounds, such as $Cu_2ZnSnS_4$, $Cu_2ZnSnSe_4$ and/or their solid solutions.

According to one embodiment, the PV cell further comprises a thin conductive layer between said nanorod metal oxide layer and said blocking layer. According to one embodiment, said conductive layer is a doped metal oxide layer, such as indium or aluminium ZnO layer.

One embodiment of the invention is a PV cell, comprising a glass substrate covered with an ITO layer, a nanorod zinc oxide layer, deposited by spray from solution containing $ZnCl_2$; an indium-doped zinc oxide layer, deposited by spray from a solution comprising zinc acetate and indium ions ($In^{3+}$ ions); a blocking layer, prepared by dip coating or by spray from titanium alkoxide sol; a buffer layer comprising $In_2S_3$ and prepared by spray; and absorber layer, comprising $CuInS_2$, prepared by spray.

Another aspect of the invention is a method for manufacturing PV cells with structures as described above. Such structures are prepared solely by or mostly by chemical spray pyrolysis deposition.

According to one embodiment, the method comprises depositing a metal oxide, such as ZnO nanorod layer by chemical spray deposition on a transparent conductive oxide layer on a transparent substrate; depositing an extra thin blocking layer on said nanorod layer, said extra thin blocking layer comprising $TiO_2$ or $In_xS_y$ (where x and y are integer numbers); depositing a buffer layer on said thin blocking layer, said buffer layer comprising $In_2S_3$; and depositing an absorber layer on said buffer layer, said absorber layer comprising $CuInS_2$; and attaching electrical contacts to said transparent oxide layer and to said absorber layer.

According to one embodiment, the metal oxide nanorod layer is deposited by spray from solution containing $ZnCl_2$.

According to one embodiment, the method additionally comprises a step of depositing a conductive doped metal oxide layer on said metal oxide nanorod layer.

BRIEF DESCRIPTION OF THE DRAWINGS

The technical essence of the invention is described in details by following figures.

FIG. 2 shows SEM images of a ZnO nanocolumnar layer before and after (inset) spraying on that acidic (pH ~2.8) solution (FIG. 2A) and a solar cell structure $ZnO_R/TiO_2/In_2S_3/CIS$ (FIG. 2B).

FIG. 5 shows electron beam induced current (EBIC) (FIG. 5A) and SEM (FIG. 5B) images of the cross section of a structured solar cell TCO/$ZnO_R$/ZnO:In/$TiO_2$/$In_2S_3$/CIS.

MODES FOR CARRYING OUT THE INVENTION

Figure 1:
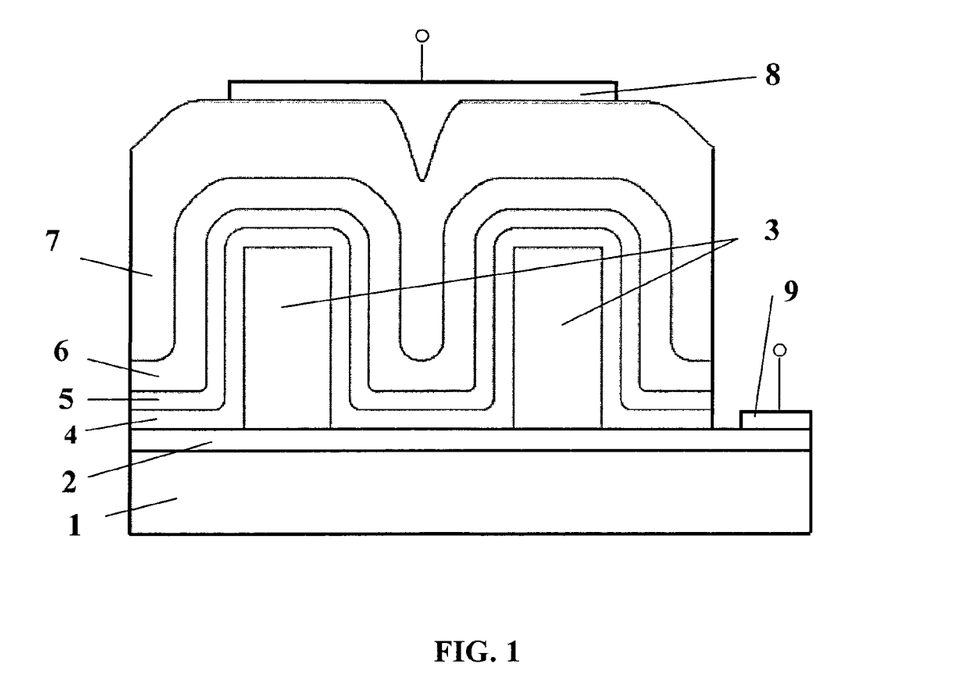
FIG. 1 shows a simplified schematic view of a photovoltaic cell according to the invention.
Figure 2A:
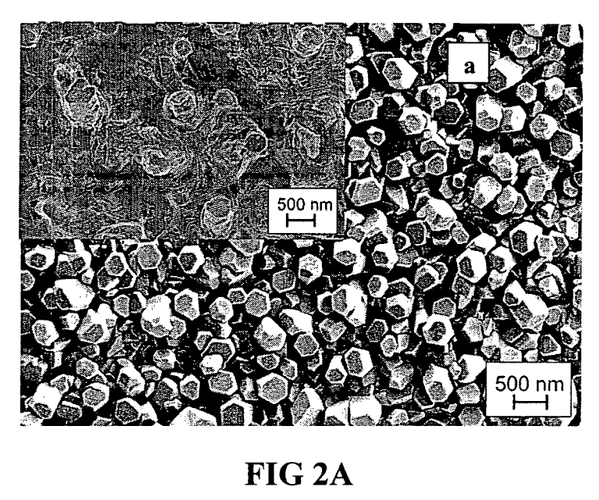
Figure 2B:
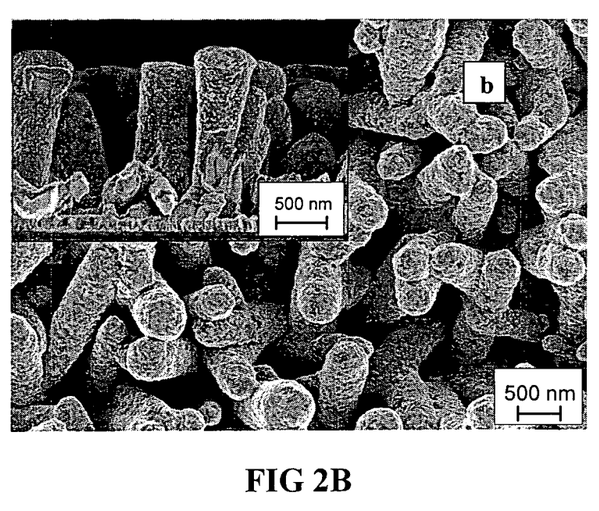

The photovoltaic cell (PV cell, or solar cell) according to one embodiment of the present invention is schematically depicted in FIG. 1. The PV cell is built on suitable transparent substrate 1 that is covered with transparent conductive oxide (TCO) layer 2. Glass is one of the most suitable materials for the substrate. TCO layer is typically tin oxide, e.g., fluorine-doped tin oxide ($SnO_2$:F, or FTO), or indium tin oxide (ITO) or indium, fluorine or aluminum-doped zinc oxide (ZnO:In, ZnO:F, or ZnO:Al). TCO-covered glass is commercially available from many manufacturers.

A nanorod layer 3, such as zinc oxide nanorod ($ZnO_R$) layer is deposited on said TCO substrate. The nanorod layer is preferably prepared by chemical spray pyrolysis deposition (hereinafter, spray). ZnO layer comprises elongated crystals. According to selective area electron diffraction (SAED) study the sprayed ZnO nanorods grown at temperatures above 500° C. are single crystals. According to the photoluminescence studies which shows strong near-band-edge (NBE) emission in UV region and very weak green emission, the sprayed ZnO nanorods are of high crystal quality and chemical purity.

Electrical characterization, incl Kelvin probe measurements reveal that ZnO nanorods by spray may be single crystals with low concentration of free carriers. For better carrier collection, a thin conductive metal oxide layer 4, such as indium-doped zinc oxide (ZnO:In) layer is deposited on the nanorod layer 3 and generally follows the shape of the rods. The conductive layer 4 is also preferably prepared by spray. In background art, the ZnO rods, typically prepared by electrodeposition, are heavily doped.

An extra thin blocking layer 5 (with thickness less than 50 nm, preferably less than 10 nm, most preferably less than 5 nm) is deposited on said conductive layer. Blocking layer 5 can comprise $TiO_2$ and can be made by sol-gel spray or spin coating or dip coating using a titanium alkoxide based sol. Other chemically inert oxides such as $Al_2O_3$, $ZrO_2$ and $Nb_2O_5$ can be also used. The blocking layer protects the ZnO from chemical dissolution in acidic medium during next deposition steps of solar cell fabrication, namely during the spray deposition of acidic (pH~3) solution to make $In_2S_3$ buffer and copper indium disulfide (CIS) absorber layers. Blocking layer also avoids the electrical short circuiting of the solar cell structure. The thickness of the blocking layer should be optimized to provide tunneling of the carriers.

The blocking layer 5 may comprise indium sulfide or titanium dioxide and may be deposited by spray. This reduces the preparation time and preserves continual spray process and thus, provides simple and straightforward solar cell fabrication process. According to the SEM study, thin, dense and pinhole-free films of InS or $TiO_2$ can be formed by spray.

The buffer layer 6 is deposited on the blocking layer 5. Buffer layer may comprise $In_2S_3$ and is preferably deposited by spray. Absorber layer 7 is deposited on buffer layer. Absorber layer is preferably CIS ($CuInS_2$) layer, preferably deposited by spray. However, other chemical vapor deposition and solution based techniques may be also used. Also other absorber materials may be used, such as other Cu-based chalcopyrites such as $CuInSe_2$, $CuInGaS_2$, $CuInGaSe_2$ and their solid solutions, or suitable Ag-based materials and their solid solutions; or In-free multinary compounds, CZTS, such as $Cu_2ZnSnS_4$, $Cu_2ZnSnSe_4$.

The solar cell has electrodes attached to the p-type absorber layer as a back contact 8 and to transparent conductive oxide layer as a front contact 9. For the back contact any suitable method and material commonly used for electrodes can be used, e.g., metals with high work function Co, Au, Ni, Pd, Pt or graphite or hole conductor layer PEDOT:PSS, CuSCN, CuI, $CuAlO_2$, NiO with a contact formed of suitable metal such as Co, Au, Ni, Pd, Pt.

Figure 3A:
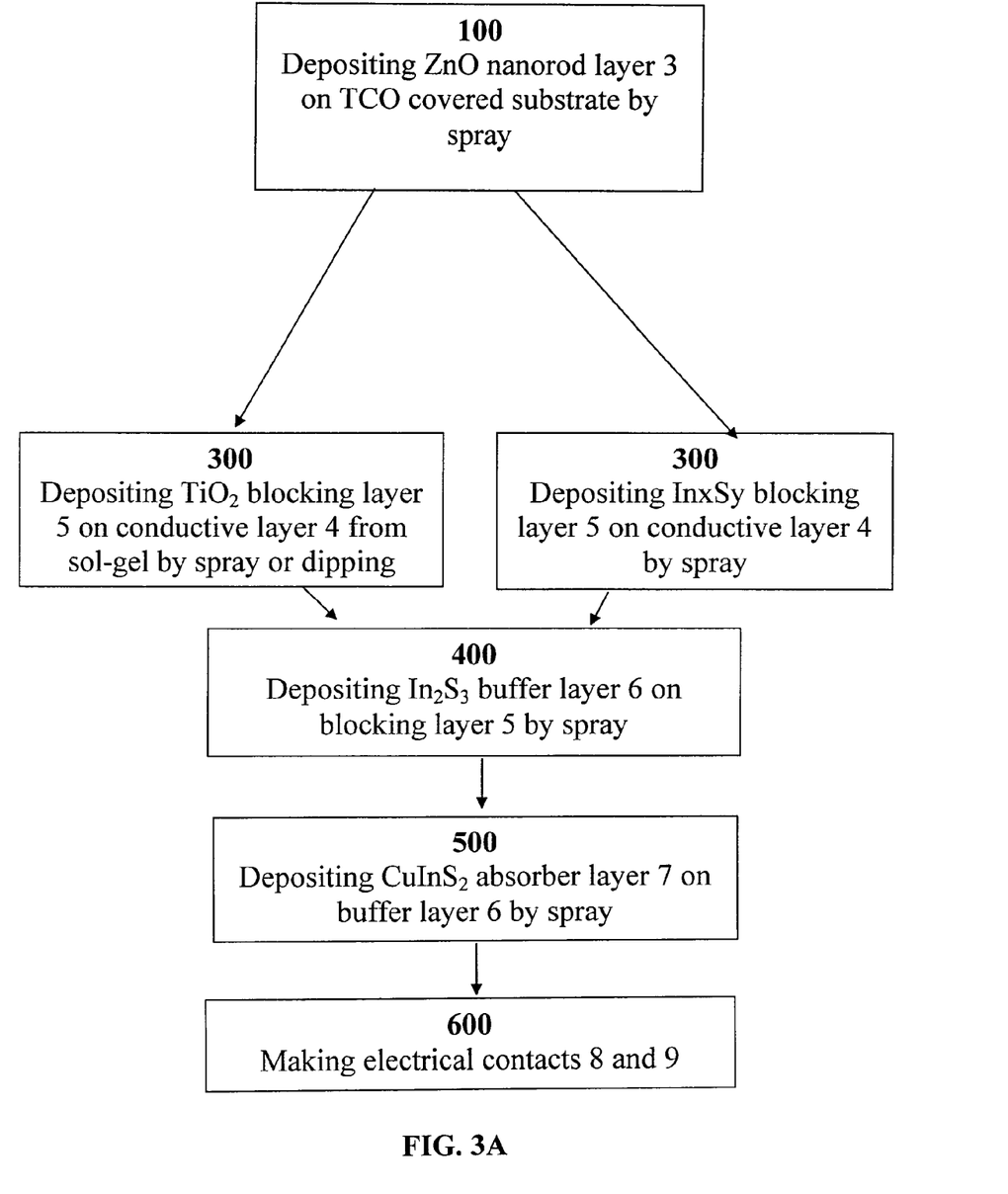
FIG. 3A shows a flowchart illustrating the method of manufacturing the PV cell according to one embodiment of the invention.
Figure 3B:
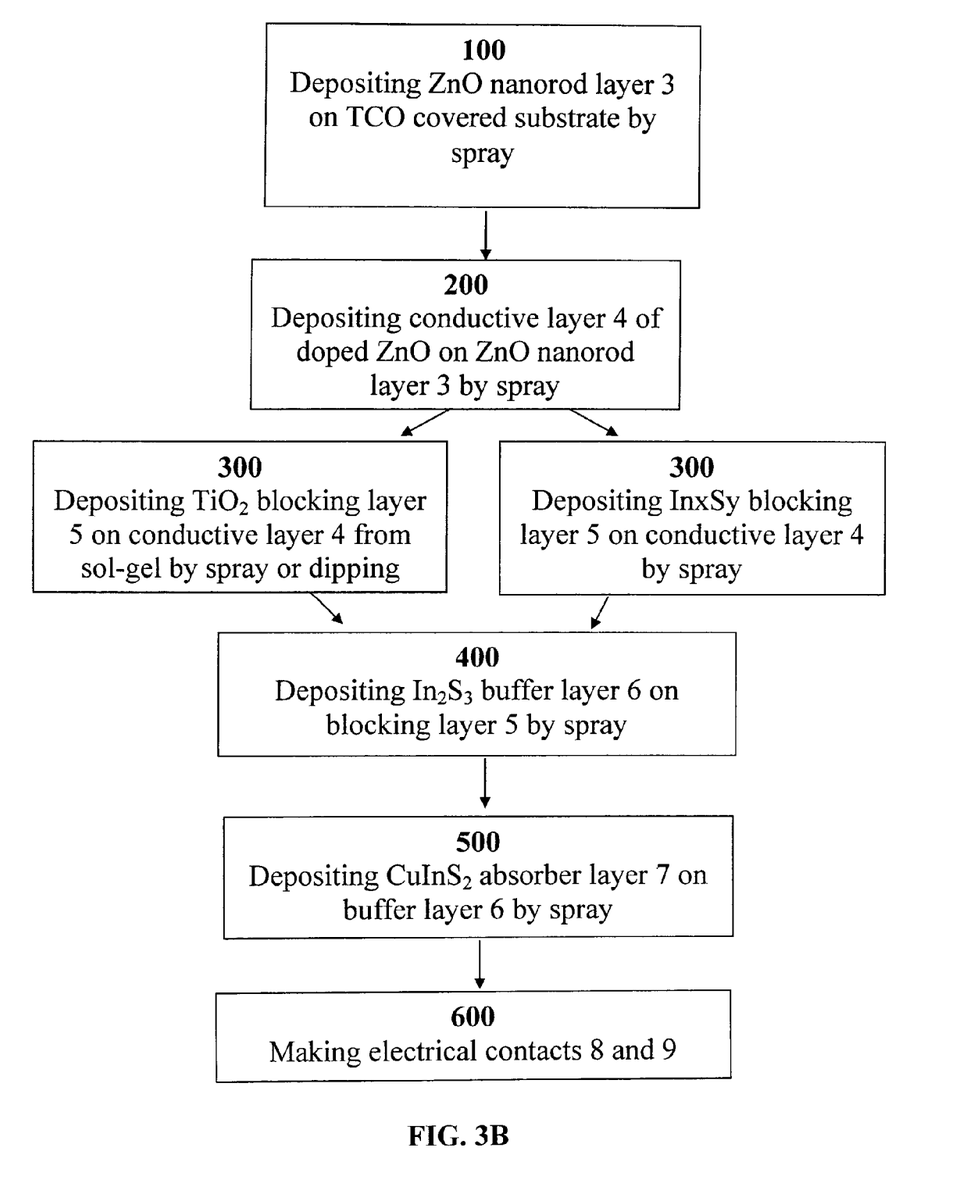
FIG. 3B shows a flowchart illustrating the method of manufacturing the PV cell according to another embodiment of the invention.

FIGS. 3A and 3B show flowchart, illustrating the methods of manufacturing PV cells according to the embodiments of the invention.

The method shown in FIG. 3A comprises step 100 of depositing a nanorod layer 3 of metal oxide by spray on suitable TCO substrate, such as ITO covered glass. Metal oxide is preferably zinc oxide. Then follows step 300 of depositing an extra thin blocking layer 5 on said nanorod layer, covering the tops and sides of the rods. The blocking layer is preferably also deposited by spray and comprises $In_xS_y$ (where x and y are integer numbers), or $TiO_2$. Follows step 400 of depositing a buffer layer 6 on the blocking layer 5. The buffer layer may comprise $In_2S_3$ and is also preferably deposited by spray. Then follows step 500 of depositing absorber layer 7 on the buffer layer. Absorber layer is preferably CIS ($CuInS_2$) layer, and is preferably deposited by spray.

The final step 600 is attaching suitable electrodes to the transparent conductive oxide layer 2 and to the absorber layer 7.

The nanorod layer prepared by spray consists of single crystals while such crystals may be, depending on the deposition parameters, of very high purity. To improve the carrier collection in such PV cell, additional conductive layer may be needed between the nanorod layer and the blocking layer. To manufacture such PV cells, the method is modified as shown in FIG. 3B. The method additionally comprises step 200 after step 100. Step 200 is depositing a thin conductive layer 4 of doped metal oxide, such as indium or aluminium doped zinc oxide onto the nanorod layer 3 by spray, covering the tops and the sides of the rods. Then follows step 300 of depositing an extra thin blocking layer 5 on said thin conductive layer. Other steps 400, 500 and 600 are as described above.

EXAMPLE 1

Zinc oxide (ZnO) nanorods were deposited by spray of zinc chloride ($ZnCl_2$) aqueous solution onto indium tin oxide (ITO) covered glass substrates placed on the hot plate (laboratory device developed by Tallinn University of Technology) heated up to about 600° C. The concentration of $ZnCl_2$ in spray solution was about 0.1 mol/l. ZnO nanorod ($ZnO_R$) layers deposition by spray technique are described in more details in our PCT application PCT/EE2006/000002, published as WO2006108425.

The next layers of the solar cell were deposited in the following order: a thin conductive layer of indium doped zinc oxide (ZnO:In), an extra thin blocking layer $TiO_2$, a buffer layer $In_2S_3$ and finally, $CuInS_2$ (CIS) absorber layer.

The conductive layer of indium-doped zinc oxide (ZnO:In) was deposited onto the ZnO nanorods at hot plate temperature of about 500° C. from about 20 ml of about 0.2 mol/l $Zn(CH_3COO)_2$ solution containing $InCl_3$ ([In]/([Zn]=3 at %).

The extra thin blocking layer of $TiO_2$ with thickness less than or about 10 nm was prepared by sol-gel dip coating method by immersing the substrate in the titania sol (acetylacetone stabilised titaniumtetraisopropoxide, prepared at TTIP:acacH=1:1 in ethanol (other alcohols, such as isopropanol, 2-metoxyethanol may be used) where TTIP=titaniumtetraisopropoxide, $C_{12}H_{28}O_4Ti$ and acacH=acetylacetone, $C_5H_8O_2$). Dip coating was made at room temperature followed by drying at about 80° C., and then heated for about 30 minutes at about 450° C. in a laboratory oven.

Indium sulfide ($In_2S_3$) buffer layer was deposited by spray using an aqueous spray solution of $InCl_3$ and $SC(NH_2)_2$ with molar ratio of In:S=1:3 at concentration of $InCl_3$ of $2\times10^{-3}$ mol/l and pH ~3.

$CuInS_2$ (CIS) absorber layer was deposited by spray using a solution containing $InCl_3$, $CuCl_2$ and $SC(NH_2)_2$ at molar ratios of Cu:In:S=1:1:3 and following the deposition route described in details in our US patent application published as US20050271827. Indium sulfide layers and CIS absorber layer were deposited at similar temperature of 300° C.

Figure 4A:
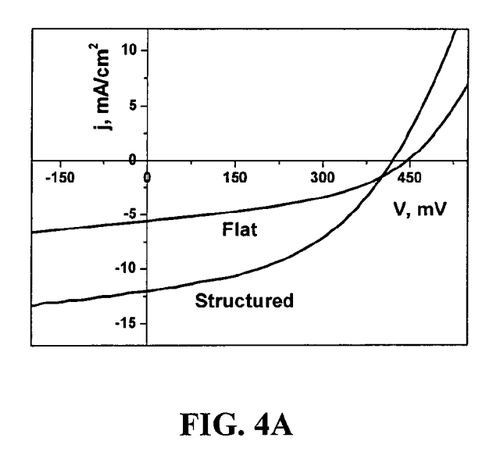
FIG. 4A is a current-voltage characteristics of a PV cell according to the invention (structured cell) compared to a flat PV cell (respectively, cell 1 and cell 2 shown in Table 1) under halogen lamp illumination of 100 mW/cm2.

For comparison, flat PV cells (i.e., with flat ZnO layer instead of $ZnO_R$ layer) were prepared simultaneously with the structured samples. As can be seen from FIG. 4 and from Table 1, examples 1 and 2, the structured PV cell has substantially higher current j and efficiency.

EXAMPLE 2

Zinc oxide (ZnO) nanorods with length of about 1 micron were deposited as in Example 1.

$TiO_2$ films were deposited by sol-gel spray pyrolysis method onto the substrate with ZnO rods using a sol composed of a titanium alkoxide (titanium (IV)isopropoxide) with concentration 0.1 mol/l and a stabilizer (acetylacetone) at molar ratio of 1:2 to 1:4 in ethanol (other alcohols may be used). The sol was pulverized onto the substrate heated up to 450° C. employing 2 to 20 spray pulses (1 second spray+30 second pause). Sprayed $TiO_2$ films were amorphous according to Raman spectra. X-ray photoelectron spectroscopic study revealed that four spray pulses had produced a continuous and pinhole free $TiO_2$ film with the thickness of less than 5 nm on planar surfaces.

Indium sulfide ($In_2S_3$) buffer layer and $CuInS_2$ (CIS) absorber layer were deposited as in Example 1.

Figure 4B:
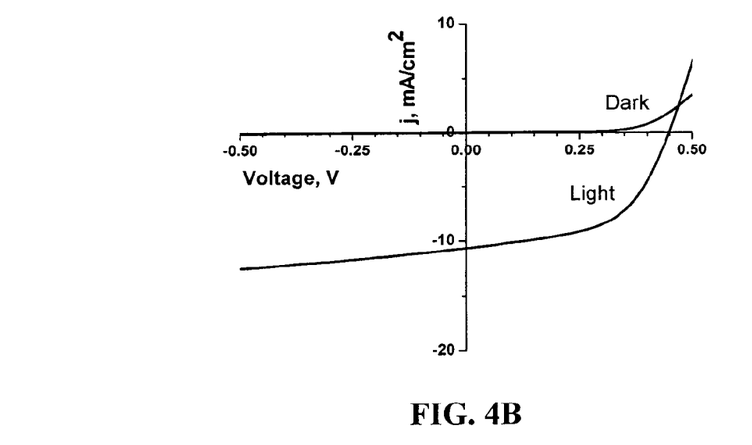
FIG. 4B is a current-voltage characteristics (in dark and under the illumination) of all-layers-sprayed PV cell ITO/$ZnO_R$/TiO2/In2S3/CuInS2 with a cell conversion efficiency of the cell 2.6% (cell 4 shown in Table 1).
Figure 4C:
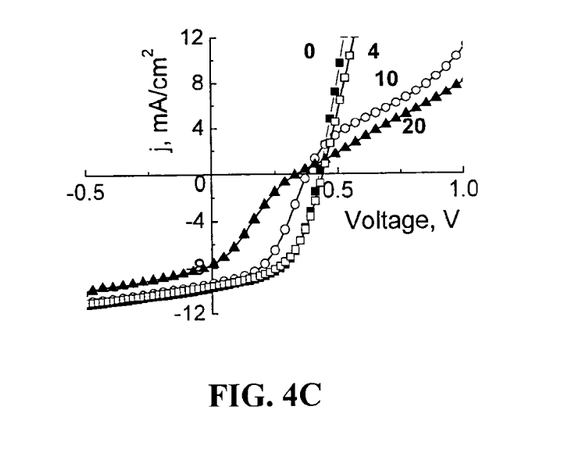
FIG. 4C is a current-voltage characteristics of structured PV cells with different thickness of spray-deposited TiO2 layer. Thickness is controlled by number of the spray pulses shown by Arabic numerals on the graph.

$TiO_2$ film from 2-4 spray pulses forms a chemical blocking layer on ZnO rods resulting simultaneously in reduction of the electrical short circuits between front and back contacts and sufficient tunneling of the charge carriers through the interface barrier. Applying thicker $TiO_2$ films led to S-shaped I-V curves of the solar cells (see FIG. 4C), accompanied by a drastic decrease in the cell fill factor and efficiency due to an additional rectifying interface in the circuit. The best all-layers-sprayed $ZnO_R/TiO_2/In_2S_3$/CIS cell shows conversion efficiency of 2.6% (Voc=450 mV, j=11 mA/cm2, FF=54%) versus 1.6% of the flat PV cell under white light illumination of 100 mW/cm2. I-V curves of the structured solar cell with sprayed $TiO_2$ layer from 4 spray pulses is presented in FIG. 4B.

EXAMPLE 3

Zinc oxide (ZnO) nanorod layer was deposited by spray. 50 ml of $ZnCl_2$ aqueous solution with concentration of 0.07 mol/l with pH of 2.0-2.2 was sprayed at the rate of 2.5 ml/min onto pre-heated ITO electrode coated glass substrates kept at constant temperature of about 600-620° C. Acidity of the solution was adjusted via addition of HCl into the aqueous solution of $ZnCl_2$. The substrates were continuously rotated to obtain uniform layers. The air was used as carrier gas with air flow rate 8 l/min.

Using acidic spray solution with pH of around 2 instead of 5 supports the formation of a layer composed of ZnO nanorods, i.e., elongated crystals instead of a compact layer of ZnO. The use of acidic solution reduces the number of ZnO nucleation centers by dissolving the smaller nucleation centers and allowing rods to grow on bigger centers without growing together. Using acidic spray solution makes the process much less dependant on the surface properties of the TCO layer and thus makes easier to find suitable TCO substrates for manufacturing PV cells. Also, ZnO nanorods grown from acidic solution are more conductive than nanorods from non-acidic solution.

Thin, compact and dense layer of $In_xS_y$ was deposited on the ZnO nanorod layer by spray using 25 ml of the spray solution containing $InCl_3$ and thiocarbamide $SC(NH_2)_2$ at molar ratio of In:S=1:3 with $InCl_3$ concentration of $4\times10^{-4}$ mol/l and solution pH ~5, solution spray rate of about 1 ml/min, the substrate temperature was kept constant at about 300° C. $In_xS_y$ is composed of In and S atoms and there is no oxygen in the layer according to the X-ray photoelectron spectroscopy. Band gap of $In_xS_y$ is 2.0 eV, assuming indirect transitions, and thus, similar to that of $In_2S_3$. Layer of $In_xS_y$ on ZnO rods is amorphous according to Raman spectroscopy; extremely thin layer of $In_xS_y$ is compact and without pinholes and covers uniformly ZnO rods according to SEM study.

$In_2S_3$ buffer layer was deposited as in Examples 1 and 2.

CuInS$_2$ absorber layer was deposited as in Examples 1 and 2.

Figure 4D:
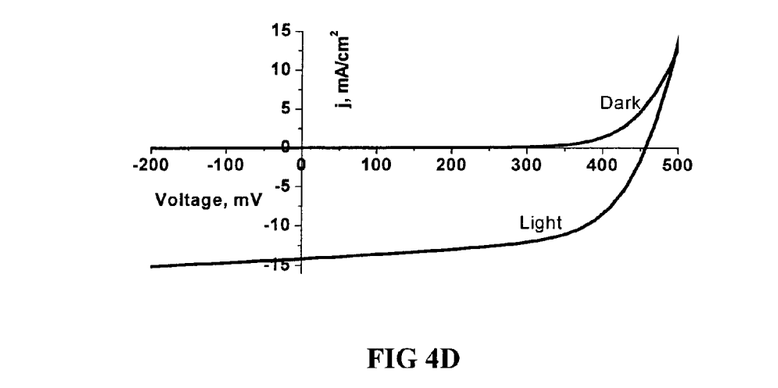
FIG. 4D is a current-voltage characteristics (in dark and under the illumination) of all layers sprayed structured PV cell ITO/$ZnO_R$/$In_xS_y$/$In_2S_3$/$CuInS_2$ with a cell conversion efficiency 3.9% (cell 6 shown in Table 1).
Figure 5A:
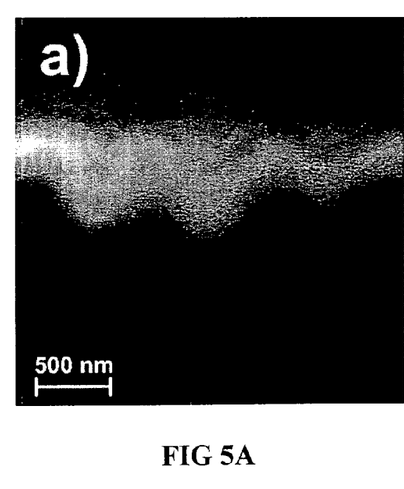
Figure 5B:
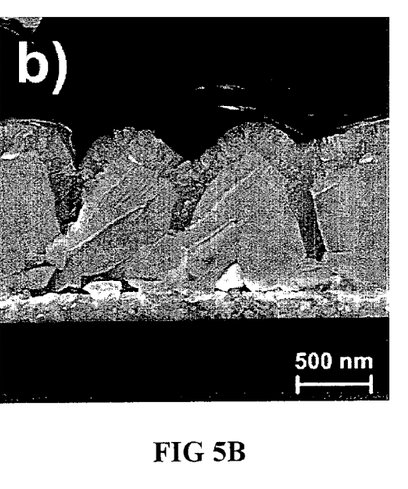
Figure 6:
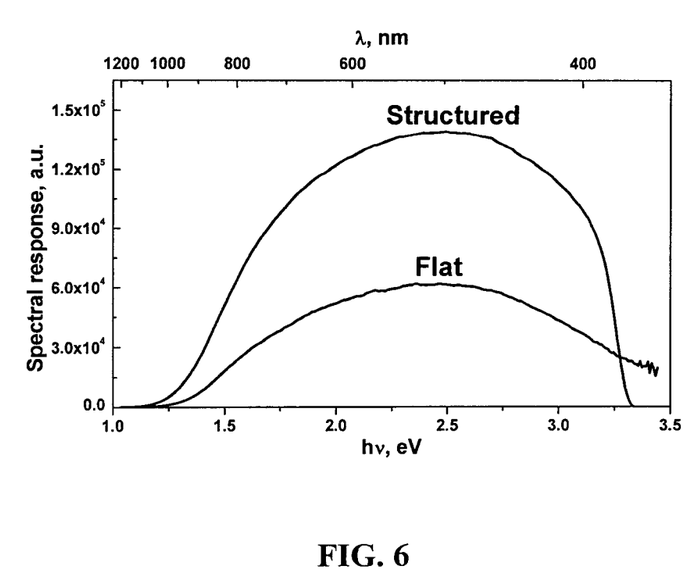
FIG. 6 is a spectral response of a PV cell according to the invention (structured cell) compared to a flat PV cell (respectively, cell 1 and cell 2 shown in Table 1).

Conductive carbon paste was used to make a back contact to CuInS2 absorber. Carbon paste contacts with determined area were prepared, solvent was removed by heating the contacts for 60 minutes at 200° C. in air. Our best cell showed the conversion efficiency of 3.9% (Voc=457 mV, j=14.1 mA/cm2, FF=60.3%) under the white light illumination 100 mW/cm2. I-V curves of the solar cell in dark and under the illumination are presented in FIG. 4D.

Table 1 shows output characteristics of flat and structured solar cells under the halogen lamp illumination with intensity of 100 mW/cm2, where cell No denotes:

1—TCO/ZnO:In/TiO$_2$(by dip)/In$_2$S$_3$/CIS (flat);
2—TCO/ZnO$_R$/ZnO:In/TiO$_2$ (by dip)/In$_2$S$_3$/CIS (structured);
3—TCO/ZnO:In/TiO$_2$ (by spray)/In$_2$S$_3$/CIS (flat);
4—TCO/ZnOR/ZnO:In/TiO$_2$ (by spray)/In$_2$S$_3$/CIS (flat
5—TCO/ZnO/In$_x$S$_y$/In$_2$S$_3$/CIS (flat);
6—TCO/ZnO$_R$/ZnO:In/In$_x$S$_y$/In$_2$S$_3$/CIS (structured).

TABLE 1

| Cell No. | Cell structure | Chemically Blocking layer | Voc, mV | j, mA/cm$^2$ | FF, % | Eff., % |
|---|---|---|---|---|---|---|
| 1 | flat | TiO$_2$ (dipping) | 445 | 5.5 | 41 | 1.0 |
| 2 | Structured | " | 425 | 12.0 | 43 | 2.2 |
| 3 | Flat | TiO$_2$ (spray) | 440 | 6.2 | 58 | 1.6 |
| 4 | Structured | " | 450 | 11.0 | 54 | 2.6 |
| 5 | Flat | In$_x$S$_y$ | 485 | 4.3 | 63 | 1.3 |
| 6 | Structured | In$_x$S$_y$, no ann. | 420 | 12.8 | 53 | 2.9 |
|   |   | In$_x$Sy, annealed | 457 | 14.1 | 60 | 3.9 |

Although this invention is described with respect to a set of aspects and embodiments, modifications thereto will be apparent to those skilled in the art. The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

The invention claimed is:

1. A photovoltaic cell structure, comprising:
a transparent substrate covered with a transparent conductive oxide layer;
zinc oxide nanorods deposited in direct physical contact with said transparent conductive oxide layer;
an extremely thin blocking layer shelling said nanorods of said zinc oxide layer, said blocking layer comprising TiO$_2$ or In$_x$S$_y$, wherein x, y are integer numbers;
a buffer layer on said extremely thin blocking layer, said buffer layer comprising a material selected from a group of In$_2$S$_3$, CdS and ZnS;
an absorber layer on said buffer layer, said absorber layer comprising a material selected from the group of CuInS$_2$; and
a pair of electrodes, the first electrode attached to said transparent conductive oxide layer and the second electrode attached to said absorber layer.

2. A photovoltaic cell structure as in claim 1, comprising a thin conductive layer of doped zinc oxide between said zinc oxide nanorods and said extremely thin blocking layer.

3. A photovoltaic cell structure as in claim 2, wherein said thin conductive layer is indium doped zinc oxide layer.

4. A photovoltaic cell structure as in claim 1, wherein said transparent substrate is glass and said transparent conductive oxide is selected from the group of indium tin oxide, fluorine-doped tin oxide, and indium-, fluorine- or aluminum-doped zinc oxide.

5. A photovoltaic cell structure as in claim 4, wherein all layers of the photovoltaic cell are prepared by chemical spray deposition.

6. A photovoltaic cell structure as in claim 1, wherein said extremely thin blocking layer comprising TiO$_2$ has thickness less than 10nm.

7. A photovoltaic cell structure as in claim 1, wherein said extremely thin blocking layer comprising TiO$_2$ has thickness less than 5nm.

* * * * *